US012707817B2

(12) United States Patent
Ko et al.

(10) Patent No.: US 12,707,817 B2
(45) Date of Patent: Aug. 11, 2026

(54) DISPLAY APPARATUS

(71) Applicant: Samsung Display Co., LTD., Yongin-si (KR)

(72) Inventors: Moosoon Ko, Yongin-si (KR); Kohei Ebisuno, Yongin-si (KR); Sanghoon Oh, Yongin-si (KR); Jaesoo Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 377 days.

(21) Appl. No.: 18/425,404

(22) Filed: Jan. 29, 2024

(65) Prior Publication Data

US 2024/0324293 A1 Sep. 26, 2024

(30) Foreign Application Priority Data

Mar. 24, 2023 (KR) ........................ 10-2023-0039114
Mar. 29, 2023 (KR) ........................ 10-2023-0041498

(51) Int. Cl.

*H10K 59/121* (2023.01)
*H10D 1/68* (2025.01)
*H10D 30/01* (2025.01)
*H10D 30/67* (2025.01)
*H10D 62/57* (2025.01)

(Continued)

(52) U.S. Cl.

CPC ......... *H10K 59/1216* (2023.02); *H10D 1/712* (2025.01); *H10D 30/0312* (2025.01); *H10D 30/6706* (2025.01); *H10D 30/6733* (2025.01); *H10D 62/57* (2025.01); *H10D 64/519* (2025.01); *H10D 80/215* (2025.01); *H10D 84/813* (2025.01); *H10K 59/124* (2023.02); *H10K 59/873* (2023.02)

(58) Field of Classification Search

CPC .. H10D 62/57; H10D 64/519; H10D 30/0312; H10D 30/6706; H10D 30/6733

See application file for complete search history.

(56) References Cited

U.S. PATENT DOCUMENTS 10,593,808 B2 3/2020 Park et al.
11,296,234 B2 4/2022 Joo et al.

(Continued)

FOREIGN PATENT DOCUMENTS

KR 1020020018884 A 3/2002
KR 1020190025789 A 3/2019

(Continued)

*Primary Examiner* — Victoria K. Hall

(74) *Attorney, Agent, or Firm* — CANTOR COLBURN LLP

(57) ABSTRACT

A display apparatus includes: a substrate, a semiconductor layer arranged on the substrate and including a plurality of protrusions protruding in a direction perpendicular to the substrate, a gate insulating layer arranged on the semiconductor layer, a first gate layer arranged on the gate insulating layer and including a first edge arranged on at least one protrusion of the plurality of protrusions, a first interlayer-insulating layer arranged on the first gate layer, and a second gate layer arranged on the first interlayer-insulating layer, overlapping the first gate layer when viewed in the direction perpendicular to the substrate, and upwardly exposing at least a portion of the first edge when viewed in the direction perpendicular to the substrate.

19 Claims, 8 Drawing Sheets

(51) Int. Cl.

| | |
|---|---|
| ***H10D 64/27*** | (2025.01) |
| ***H10D 80/20*** | (2025.01) |
| ***H10D 84/80*** | (2025.01) |
| ***H10K 59/124*** | (2023.01) |
| ***H10K 59/80*** | (2023.01) |

(56) References Cited

U.S. PATENT DOCUMENTS

| | | | | |
|---|---|---|---|---|
| 11,631,731 | B2 | 4/2023 | Cho et al. | |
| 2004/0248345 | A1* | 12/2004 | Chang | H10P 14/3816 438/166 |
| 2012/0301985 | A1* | 11/2012 | Shin | H10D 86/0229 438/34 |
| 2022/0077269 | A1 | 3/2022 | Lee et al. | |
| 2022/0320391 | A1* | 10/2022 | Han | H10D 86/60 |
| 2024/0079417 | A1* | 3/2024 | You | H10D 86/0221 |

FOREIGN PATENT DOCUMENTS

| | | | |
|---|---|---|---|
| KR | 1020210118330 | A | 9/2021 |
| KR | 1020210149959 | A | 12/2021 |
| KR | 1020220033637 | A | 3/2022 |

* cited by examiner

DISPLAY APPARATUS

This application claims priority to Korean Patent Applications Nos. 10-2023-0039114, filed on Mar. 24, 2023, and 10-2023-0041498 filed on Mar. 29, 2023, and all the benefits accruing therefrom under 35 U.S.C. § 119, the contents of which in their entirety are herein incorporated by reference.

BACKGROUND

1. Field

One or more embodiments relate to a display apparatus, and more particularly, to a display apparatus for preventing contact between electrodes included in a storage capacitor.

2. Description of the Related Art

A display apparatus displays an image by receiving information about the image. A display apparatus may be used as a display of a small-sized product such as a cellular phone, etc. or a display of a large-sized product such as a television, etc.

The display apparatus may include a plurality of pixels, which receive an electrical signal and then emit light, to display an image to the outside. Each pixel includes a light-emitting element. For example, an organic light-emitting display apparatus may include an organic light-emitting diode as the light-emitting element. Generally, an organic light-emitting display apparatus includes a thin-film transistor and an organic light-emitting diode formed on a substrate and operates by the organic light-emitting diode directly emitting light.

The display apparatus includes a storage capacitor, and research into the storage capacitor is continually being conducted.

SUMMARY

One or more embodiments include a display apparatus for preventing contact between electrodes included in a storage capacitor. However, this objective is an example and does not limit the scope of the disclosure.

Additional aspects will be set forth in part in the description which follows and, in part, will be apparent from the description, or may be learned by practice of the presented embodiments of the disclosure.

According to one or more embodiments, a display apparatus includes: a substrate, a semiconductor layer arranged on the substrate and including a plurality of protrusions protruding in a direction perpendicular to the substrate, a gate insulating layer arranged on the semiconductor layer, a first gate layer arranged on the gate insulating layer and including a first edge arranged on at least one protrusion of the plurality of protrusions, a first interlayer-insulating layer arranged on the first gate layer, and a second gate layer arranged on the first interlayer-insulating layer, overlapping the first gate layer when viewed in the direction perpendicular to the substrate, and upwardly exposing at least a portion of the first edge when viewed in the direction perpendicular to the substrate.

When viewed in the direction perpendicular to the substrate, the at least one protrusion and the at least a portion of the first edge may overlap each other.

The at least a portion of the first edge may include a 1-1$^{st}$ protruding portion protruding in the direction perpendicular to the substrate, correspondingly to the at least one protrusion.

When viewed in the direction perpendicular to the substrate, the second gate layer may upwardly expose the 1-1$^{st}$ protruding portion.

The 1-1$^{st}$ protruding portion may be apart from the second gate layer.

The second gate layer may define an opening or a notch portion therein upwardly exposing the 1-1$^{st}$ protruding portion when viewed in the direction perpendicular to the substrate.

The semiconductor layer may have a 1-a$^{th}$ width in a first direction in which the first edge extends, the opening or the notch portion may have a 1-b$^{th}$ width in the first direction, and the 1-a$^{th}$ width may be less than the 1-b$^{th}$ width.

The first gate layer may further include a second edge facing the first edge, and the second edge may be arranged on at least one other protrusion of the plurality of protrusions.

The second gate layer may upwardly expose at least a portion of the second edge when viewed in the direction perpendicular to the substrate.

When viewed in the direction perpendicular to the substrate, the at least one other protrusion of the plurality of protrusions and the at least a portion of the second edge may overlap each other.

The at least a portion of the second edge may include a 2-1$^{st}$ protruding portion protruding in the direction perpendicular to the substrate, correspondingly to the at least one other protrusion.

When viewed in the direction perpendicular to the substrate, the second gate layer may upwardly expose the 2-1$^{st}$ protruding portion.

The 2-1$^{st}$ protruding portion may be apart from the second gate layer.

The second gate layer may define an opening or a notch portion therein upwardly exposing the 2-1$^{st}$ protruding portion when viewed in the direction perpendicular to the substrate.

The semiconductor layer may have a 1-1$^{st}$ width in a second direction in which the second edge extends, the opening or the notch portion may have a 1-2$^{nd}$ width in the second direction, and the 1-1$^{st}$ width may be less than the 1-2$^{nd}$ width.

According to one or more embodiments, a display apparatus includes a substrate, a semiconductor layer arranged on the substrate and including a plurality of protrusions on an upper surface thereof, a first gate layer arranged on the semiconductor layer, insulated from the semiconductor layer, and including, on an upper surface thereof, a plurality of protruding portions having a shape corresponding to a shape of the plurality of protrusions, and a second gate layer covering the first gate layer, insulated from the first gate layer, and, when viewed in a direction perpendicular to the substrate, upwardly exposing a 1-1$^{st}$ protruding portion from among the plurality of protruding portions, where the 1-1$^{st}$ protruding portion is arranged on a first edge of the first gate layer.

The second gate layer may define an opening or a notch portion therein upwardly exposing the 1-1$^{st}$ protruding portion when viewed in the direction perpendicular to the substrate.

The first gate layer may include a second edge facing the first edge, the second gate layer may upwardly expose a 2-1$^{st}$ protruding portion from among the plurality of protruding portions, and the 2-1$^{st}$ protruding portion may be arranged on the second edge.

The second gate layer may define an opening or a notch portion therein exposing the 2-1$^{st}$ protruding portion when viewed in the direction perpendicular to the substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
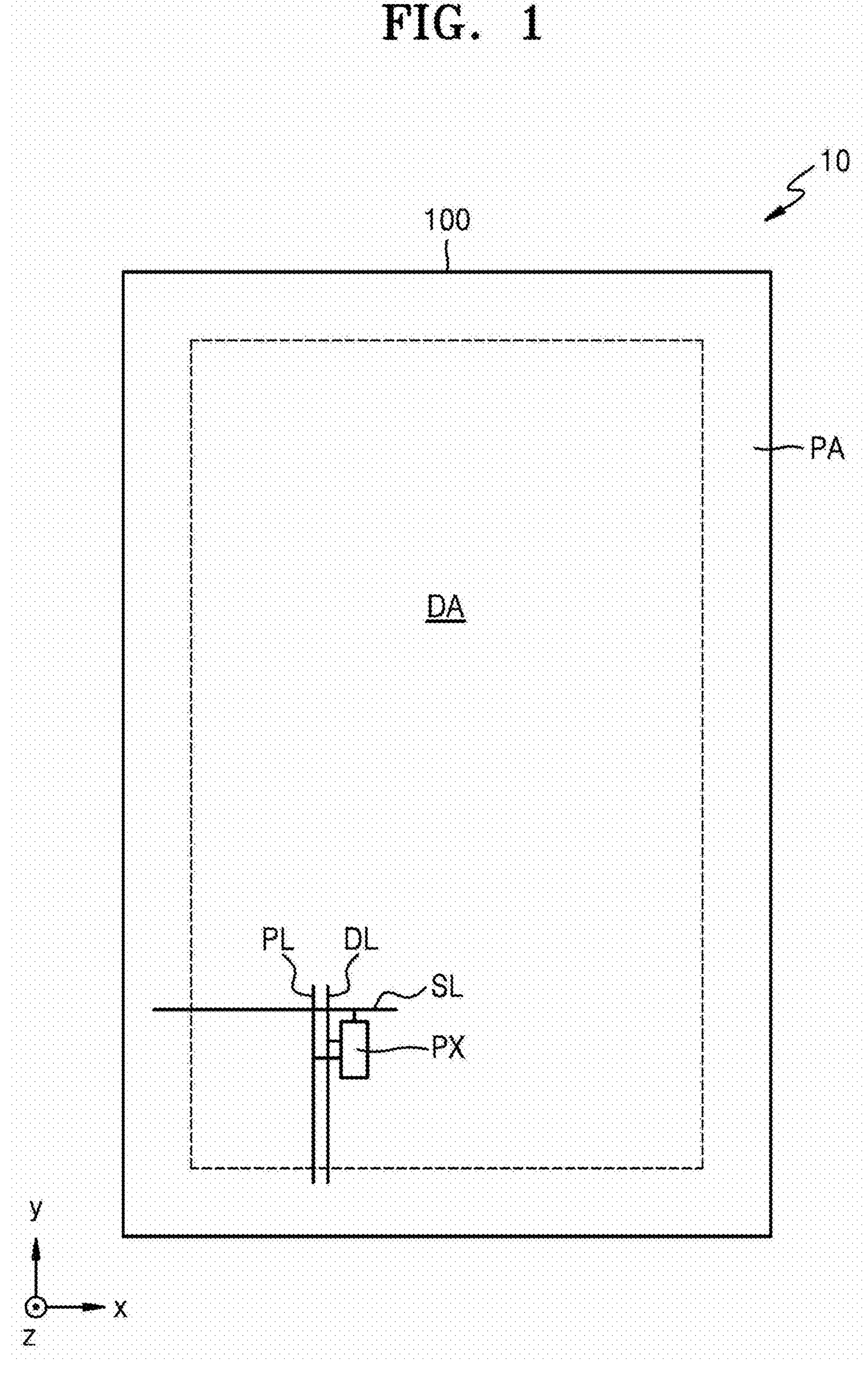
FIG. 1 is a schematic plan view of a display panel of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to elements that are the same or substantially the same and descriptions will not be repeated.

In embodiments to be described hereinafter, when elements, such as a layer, a film, an area, a plate, etc. are referred to as being "on" another element, the reference may indicate not only a case where the element is "directly on" the other element, but also a case where yet another element is between the element and the other element. Also, for convenience of explanation, elements in the drawings may have exaggerated or reduced sizes. For example, sizes and thicknesses of the elements in the drawings are randomly indicated for convenience of explanation, and thus, the disclosure is not necessarily limited to the illustrations of the drawings.

In the embodiments hereinafter, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. Hereinafter, a display apparatus according to an embodiment is described in detail based on the above descriptions.

FIG. 1 is a schematic plan view of a display panel of a display apparatus according to an embodiment.

As illustrated in FIG. 1, the display apparatus according to an embodiment may include the display panel 10. The display apparatus may include any types of display apparatuses that include the display panel 10. In an embodiment, for example, the display apparatus may include various apparatuses, such as a smartphone, a tablet computer, a laptop, a television, an advertising board, or the like. The display apparatus according to an embodiment may include thin-film transistors, a capacitor, etc., wherein the thin-film transistors, the capacitor, etc. may be realized by conductive layers and insulating layers.

The display panel 10 may include a display area DA and a peripheral area PA outside the display area DA. FIG. 1 illustrates that the display area DA has a rectangular shape. However, the disclosure is not limited thereto. The display area DA may have various shapes, such as a circular shape, an oval shape, a polygonal shape, a shape of a predetermined figure, etc.

The display area DA is an area in which an image is displayed, and a plurality of pixels PX may be arranged in the display area DA. Each pixel PX may include a display device, such as an organic light-emitting diode. Each pixel PX may emit, for example, red, green, or blue light. The pixel PX may be connected to a pixel circuit including a thin-film transistor, a storage capacitor, etc. The pixel circuit may be connected to a scan line SL configured to transmit a scan signal, a data line DL crossing the scan line SL and configured to transmit a data signal, a driving voltage line PL configured to supply a driving voltage, etc. The scan line SL may extend in an x direction (hereinafter, a "second direction"), and the data line DL and the driving voltage line PL may extend in a y direction (hereinafter, a "first direction").

The pixel PX may emit light having a brightness corresponding to an electrical signal from the pixel circuit electrically connected to the pixel PX. The display area DA may display a predetermined image through the light emitted from the pixel PX. For reference, the pixel PX may be defined as an emission area in which any one of red, green, and blue light is emitted as described above.

The peripheral area PA is an area in which the pixel PX is not arranged and may be an area in which an image is not displayed. A power supply line, etc. configured to drive the pixel PX may be arranged in the peripheral area PA. Also, a plurality of pads may be arranged in the peripheral area PA, and a printed circuit board including a driving circuit portion or an integrated circuit device, such as a driver integrated circuit ("IC"), may be arranged to be electrically connected to the plurality of pads.

For reference, the display panel 10 may include a substrate 100, and thus, it may be described that the substrate 100 may include the display area DA and the peripheral area PA. Detailed aspects with respect to the substrate 100 will be described below.

Also, a plurality of transistors may be arranged in the display area DA. With respect to the plurality of transistors, according to types (N types or P types) and/or operation conditions of the transistors, first terminals of the transistors may be source electrodes or drain electrodes, and second terminals may be electrodes different from the electrodes of the first terminals. In an embodiment, for example, when the first terminal is a source electrode, the second terminal may be a drain electrode.

The plurality of transistors may include a driving transistor, a data write transistor, a compensation transistor, an initialization transistor, an emission control transistor, etc. The driving transistor may be connected between the driving voltage line PL and an organic light-emitting diode OLED, and the data write transistor may be connected to the data line DL and the driving transistor and may be configured to perform a switching operation of transmitting, to the driving transistor, a data signal transmitted through the data line DL.

The compensation transistor may be turned on according to a scan signal transmitted through the scan line SL and configured to connect the driving transistor with the organic light-emitting diode OLED to compensate for a threshold voltage of the driving transistor.

The initial transistor may be turned on according to a scan signal transmitted through the scan line SL and configured to transmit an initialization voltage to a gate electrode of the driving transistor to initialize the gate electrode of the driving transistor. The scan line connected to the initialization transistor may be a different scan line from the scan line connected to the compensation transistor.

The emission control transistor may be turned on according to an emission control signal transmitted through an emission control line, and as a result, a driving current may flow through the organic light-emitting diode OLED.

The organic light-emitting diode OLED may include a pixel electrode (an anode) and an opposite electrode (a cathode), and the opposite electrode 170 may receive a second power voltage ELVSS. The organic light-emitting diode OLED may emit light by receiving a driving current from the driving transistor to display an image.

Hereinafter, an organic light-emitting display apparatus is described as an example of the display apparatus according to an embodiment. However, the display apparatus according to an embodiment is not limited thereto. The display apparatus according to another embodiment may include an inorganic light-emitting display apparatus, an inorganic electroluminescent ("EL") display apparatus, or a quantum dot light-emitting display apparatus. That is, an emission layer of a display device included in the display apparatus may include an organic material or an inorganic material. Also, the display apparatus may include the emission layer and quantum dots located on a path of the light emitted from the emission layer.

Figure 2:
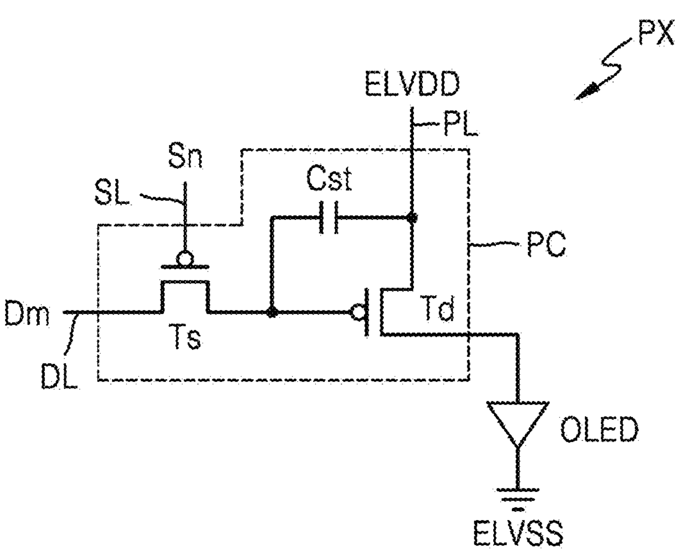
FIG. 2 is an equivalent circuit diagram of a pixel included in the display panel of FIG. 1.

FIG. 2 is an equivalent circuit diagram of a pixel included in the display panel 10 of FIG. 1.

As illustrated in FIG. 2, each pixel PX may include a pixel circuit PC connected to a scan line SL and a data line DL, and an organic light-emitting diode OLED connected to the pixel circuit PC.

The pixel circuit PC may include a driving thin-film transistor Td, a switching thin-film transistor Ts, and a storage capacitor Cst. The switching thin-film transistor Ts may be connected to the scan line SL and the data line DL and may be configured to transmit a data signal Dm provided through the data line DL, to the driving thin-film transistor Td, in response to a scan signal Sn provided through the scan line SL.

The storage capacitor Cst may be connected to the switching thin-film transistor Ts and a driving voltage line PL and may be configured to store a voltage corresponding to a difference between a voltage received from the switching thin-film transistor Ts and a first power voltage ELVDD supplied to the driving voltage line PL.

A second power voltage ELVSS may be a driving voltage having a relatively lower level than the first power voltage ELVDD. A level of a driving voltage supplied to each pixel PX may be a difference between a level of the first power voltage ELVDD and a level of the second power voltage EVLSS.

The driving thin-film transistor Td may be connected to the driving voltage line PL and the storage capacitor Cst and may be configured to control a driving current flowing from the driving voltage line PL through the organic light-emitting diode OLED according to a value of a voltage stored in the storage capacitor Cst. The organic light-emitting diode OLED may emit light having a certain brightness according to the driving current.

It is described with reference to FIG. 2 that the pixel circuit PC may include two thin-film transistors and one storage capacitor. However, the disclosure is not limited thereto. The pixel circuit PC may include two or more storage capacitors.

Figure 3:
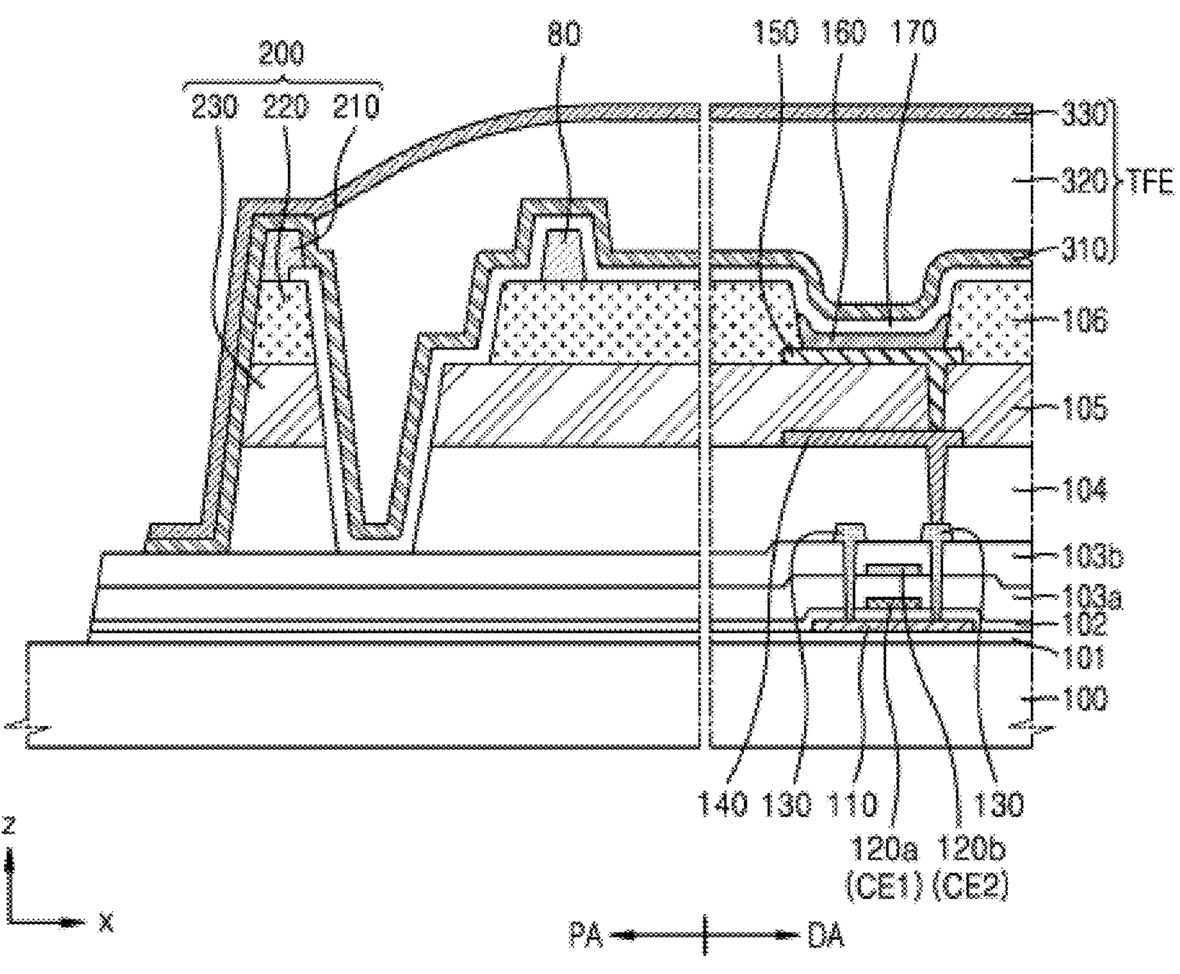
FIG. 3 is a schematic cross-sectional view of a portion of the display panel of FIG. 1.

FIG. 3 is a schematic cross-sectional view of a portion of the display panel 10 of FIG. 1.

As described above, the substrate 100 may include areas corresponding to the display area DA and the peripheral area PA outside the display area DA. The substrate 100 may include various materials having flexible or bendable properties. In an embodiment, for example, the substrate 100 may include glass, metal, or polymer resins. Also, the substrate 100 may include polymer resins, such as polyethersulphone, polyacrylate, polyetherimide, polyethylene naphthalate, polyethylene terephthalate, polyphenylene sulfide, polyarylate, polyimide, polycarbonate, or cellulose acetate propionate. However, various modifications may be possible. In an embodiment, for example, the substrate 100 may have a multi-layered structure including: two layers each including the polymer resins described above; and a barrier layer between the two layers, the barrier layer including an inorganic material (such as silicon oxide, silicon nitride, silicon oxynitride, or the like).

A buffer layer 101 may be arranged on the substrate 100. The buffer layer 101 may prevent diffusion of impurity ions, prevent the penetration of water or external materials, and function as a barrier layer for planarizing a surface and/or a blocking layer. The buffer layer 101 may include silicon oxide, silicon nitride, or silicon oxynitride. Also, the buffer layer 101 may control a heat provision speed during a crystallization process for forming a semiconductor layer 110, so that the semiconductor layer 110 may be uniformly crystallized.

The semiconductor layer 110 may be arranged on the buffer layer 101. The semiconductor layer 110 may include polysilicon and may include a channel area not doped with impurities and a source area and a drain area at opposite sides of the channel area that are doped with impurities. Here, the impurities may vary according to types of thin-film transistors and may include N-type impurities or P-type impurities.

A gate insulating layer 102 may be arranged on the semiconductor layer 110. The gate insulating layer 102 may be configured to obtain an insulating property between the semiconductor layer 110 and a gate layer. The gate insulating layer 102 may include an inorganic material, such as silicon oxide, silicon nitride, and/or silicon oxynitride, and may be arranged between the semiconductor layer 110 and the gate layer. Also, the gate insulating layer 102 may have a shape to correspond to the entire surface of the substrate 100 and may have a structure in which through-holes are formed in predetermined portions. As described above, the insulating layer including an inorganic material may be formed by chemical vapor deposition ("CVD") or atomic layer deposition ("ALD"). This aspect is the same according to embodiments described below and their modified embodiments.

A first gate layer **120*a* may be arranged on the gate insulating layer 102. The first gate layer 120*a* may be arranged above the semiconductor layer 110 to overlap the semiconductor layer 110** in a plan view and may include at least one metal from among Mo, Al, Pt, Pd, Ag, Mg, Au, Ni, Nd, Ir, Cr, Li, Ca, Ti, W, and Cu.

A first interlayer-insulating layer **103*a* may be arranged on the first gate layer 120*a*. The first interlayer-insulating layer 103*a* may cover the first gate layer 120*a*. The first interlayer-insulating layer 103*a* may include an inorganic material. For example, the first interlayer-insulating layer 103*a* may include metal oxide or metal nitride. Specifically, the inorganic material may include $SiO_2$, $SiN_x$, SiON, $Al_2O_3$, $TiO_2$, $TA_2O_5$, $HfO_2$, or $ZnO_2$. According to some embodiments, the first interlayer-insulating layer 103*a*** may have a dual structure of $SiO_x/SiN_y$ or $SiN_x/SiO_y$.

A second gate layer **120*b* may be arranged on the first interlayer-insulating layer 103*a*. The second gate layer 120*b* may be arranged above the first gate layer 120*a* to overlap the first gate layer 120*a*** in a plan view and may include at least one metal from among Mo, Al, Pt, Pd, Ag, Mg, Au, Ni, Nd, Ir, Cr, Li, Ca, Ti, W, and Cu.

The second gate layer **120*b* and the first gate layer 120*a* may form the storage capacitor Cst described above with reference to FIG. 2. The first gate layer 120*a* may include a first electrode portion CE1 of the storage capacitor Cst, and the second gate layer 120*b* may include a second electrode portion CE2** of the storage capacitor Cst.

When viewed in a direction perpendicular to the substrate 100 (i.e., plan view: view in a thickness direction z of the substrate 100), an area of the second gate layer **120*b* may be greater than an area of the first gate layer 120*a*. Alternatively, when viewed in the direction perpendicular to the substrate 100, the second gate layer 120*b* may cover the first gate layer 120*a***.

A second interlayer-insulating layer **103*b* may be arranged on the second gate layer 120*b*. The second interlayer-insulating layer 103*b* may cover the second gate layer 120*b*. The second interlayer-insulating layer 103*b* may include an inorganic material. For example, the second interlayer-insulating layer 103*b* may include metal oxide or metal nitride. Specifically, the inorganic material may include $SiO_2$, $SiN_x$, SiON, $Al_2O_3$, $TiO_2$, $TA_2O_5$, $HfO_2$, or $ZnO_2$. According to some embodiments, the second interlayer-insulating layer 103*b*** may have a dual structure of $SiO_x/SiN_y$ or $SiN_x/SiO_y$.

A first conductive layer 130 may be arranged above the second interlayer-insulating layer **103*b*. The first conductive layer 130 may serve as an electrode connected to the source area and the drain area of the semiconductor layer through a through-hole included in the second interlayer-insulating layer 103*b*. The first conductive layer 130 may include one or more metals selected from among Al, Pt, Pd, Ag, Mg, Au, Ni, Nd, Ir, Cr, Li, Ca, Mo, Ti, W, and Cu. In an embodiment, for example, the first conductive layer 130** may include a Ti layer, an Al layer, and/or a Cu layer.

A first organic insulating layer 104 may be arranged on the first conductive layer 130. The first organic insulating layer 104 may cover an upper portion of the first conductive layer 130 and may have an approximately flat upper surface to serve as a planarization layer. The first organic insulating layer 104 may include, for example, an organic material, such as acryl, benzocyclobutene ("BCB"), or hexamethyldisiloxane ("HMDSO"). The first organic insulating layer 104 may include a single layer or layers and may be modified in various ways.

A second conductive layer 140 may be arranged above the first organic insulating layer 104. The second conductive layer 140 may serve as an electrode connected to the source area and the drain area of the semiconductor layer through a through-hole included in the first organic insulating layer 104. The second conductive layer 140 may include one or more metals selected from among Al, Pt, Pd, Ag, Mg, Au, Ni, Nd, Ir, Cr, Li, Ca, Mo, Ti, W, and Cu. In an embodiment, for example, the second conductive layer 140 may include a Ti layer, an Al layer, and/or a Cu layer.

A second organic insulating layer 105 may be arranged on the second conductive layer 140. The second organic insulating layer 105 may cover an upper portion of the second conductive layer 140 and may have an approximately flat upper surface to serve as a planarization layer. The second organic insulating layer 105 may include, for example, an organic material, such as acryl, BCB, or HMDSO. The second organic insulating layer 105 may include a single layer or layers and may be modified in various ways.

Also, although not illustrated in FIG. 3, an additional conductive layer and an additional insulating layer may be arranged between the conductive layer and the pixel electrode, and various embodiments may be implemented. Here, the additional conductive layer may include the same material and the same layer structure as the conductive layer described above. The additional insulating layer may include the same material and the same layer structure as the organic insulating layer described above.

A pixel electrode 150 may be arranged on the second organic insulating layer 105. The pixel electrode 150 may be connected to the second conductive layer 140 through a contact hole formed in the second organic insulating layer 105. A display device may be arranged on the pixel electrode 150. As the display device, an organic light-emitting diode OLED may be used. That is, the organic light-emitting diode OLED may be, for example, arranged on the pixel electrode 150. The pixel electrode 150 may include a transmissive conductive layer including transmissive conductive oxide, such as ITO, $In_2O_3$, or IZO, and a reflection layer including metal, such as Al or Ag. In an embodiment, for example, the pixel electrode 150 may have a triple-layered structure of ITO/Ag/ITO.

A pixel-defining layer 106 may be arranged on the second organic insulating layer 105 to cover an edge of the pixel electrode 150. That is, the pixel-defining layer 106 may cover the edge of the pixel electrode 150. The pixel-defining layer 106 may have an opening portion corresponding to the pixel PX, and the opening portion may be formed to expose at least a central portion of the pixel electrode 150. The pixel-defining layer 106 may include, for example, an organic material, such as polyimide or HMDSO. Also, a spacer 80 may be arranged on the pixel-defining layer 106.

It is illustrated that the spacer 80 may be arranged in the peripheral area PA, but the spacer 80 may be arranged in the display area DA. The spacer 80 may prevent damage to the organic light-emitting diode OLED, which may be caused by sagging of a mask in a manufacturing process using the mask. The spacer 80 may include an organic insulating material and may include a single layer or layers.

An intermediate layer 160 and an opposite electrode 170 may be arranged in the opening portion of the pixel-defining layer 106. The intermediate layer 160 may include a low-molecular-weight material or a high-molecular-weight material, and when the intermediate layer 160 includes a low-molecular-weight material, the intermediate layer 160 may include a hole injection layer, a hole transport layer, an emission layer, an electron transport layer, and/or an electron injection layer. When the intermediate layer 160 includes a high-molecular-weight material, the intermediate layer 160 may generally have a structure including a hole transport layer and an emission layer.

The opposite electrode 170 may include a transmissive conductive layer including transmissive conductive oxide, such as ITO, $In_2O_3$, or IZO. The pixel electrode 150 may be used as an anode, and the opposite electrode 170 may be used as a cathode. However, polarities of the electrodes may be the opposite.

A structure of the intermediate layer 160 is not limited to the structure described above, and the intermediate layer 160 may have various structures. In an embodiment, for example, at least one of layers included in the intermediate layer 160 may be integrally formed like the opposite electrode 170. According to another embodiment, the intermediate layer 160 may include layers patterned to correspond to a plurality of pixel electrodes 150, respectively.

The opposite electrode 170 may be arranged above the display area DA and may be arranged throughout the display area DA. That is, the opposite electrode 170 may be integrally formed to cover a plurality of pixels. The opposite electrode 170 may be electrically connected to a common power supply line (not shown) arranged in the peripheral area PA. According to an embodiment, the opposite electrode 170 may extend to a partition wall 200. A thin-film encapsulation layer TFE may entirely cover the display area DA and extend to the peripheral area PA to cover at least a portion of the peripheral area PA.

The thin-film encapsulation layer TFE may extend to an outer portion of the common power supply line. The thin-film encapsulation layer TFE may include a first inorganic encapsulation layer 310, a second inorganic encapsulation layer 330, and an organic encapsulation layer 320 arranged therebetween. The first and second inorganic encapsulation layers 310 and 330 may include one or more inorganic materials from among $Al_2O_3$, TiO, $TA_2O_5$, $HfO_2$, ZnO, $SiO_x$, $SiN_x$, and SiON.

The first and second inorganic encapsulation layers 310 and 330 may include a single layer or layers including the materials described above. The first and the second inorganic encapsulation layers 310 and 330 may include the same material as each other or different materials from each other. Thicknesses of the first and second inorganic encapsulation layers 310 and 330 may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thicknesses of the first and second inorganic encapsulation layer 310 and 330 may be the same as each other.

The organic encapsulation layer 320 may include a monomer-based material or a polymer-based material. The polymer-based material may include acryl-based resins, epoxy-based resins, polyimide, polyethylene, etc. According to an embodiment, the organic encapsulation layer 320 may include acrylate.

The partition wall 200 may be arranged in the peripheral area PA of the substrate 100. According to an embodiment, the partition wall 200 may include a portion of the first organic insulating layer 104, a portion 230 of the second organic insulating layer 105, a portion 220 of the pixel-defining layer 106, and a portion 210 of the spacer 80, but is not necessarily limited thereto.

In certain cases, the partition wall 200 may include only the portion 230 of the second organic insulating layer 105 or only the portion 220 of the pixel-defining layer 106. The partition wall 200 may be arranged to surround the display area DA and may prevent overflowing of the organic encapsulation layer 320 of the thin-film encapsulation layer TFE to the outside of the substrate 100. Thus, the organic encapsulation layer 320 may contact an inner surface of the partition wall 200 toward the display area DA. Here, that the organic encapsulation layer 320 contacts the inner surface of the partition wall 200 may be understood as that the first inorganic encapsulation layer 310 may be arranged between the organic encapsulation layer 320 and the partition wall 200, and the organic encapsulation layer 320 may contact the first inorganic encapsulation layer 310.

The first inorganic encapsulation layer 310 and the second inorganic encapsulation layer 330 may be arranged on the partition wall 200 and may extend to an edge of the substrate 100. However, in certain cases, the partition wall 200 may be provided in plural.

Figure 4:
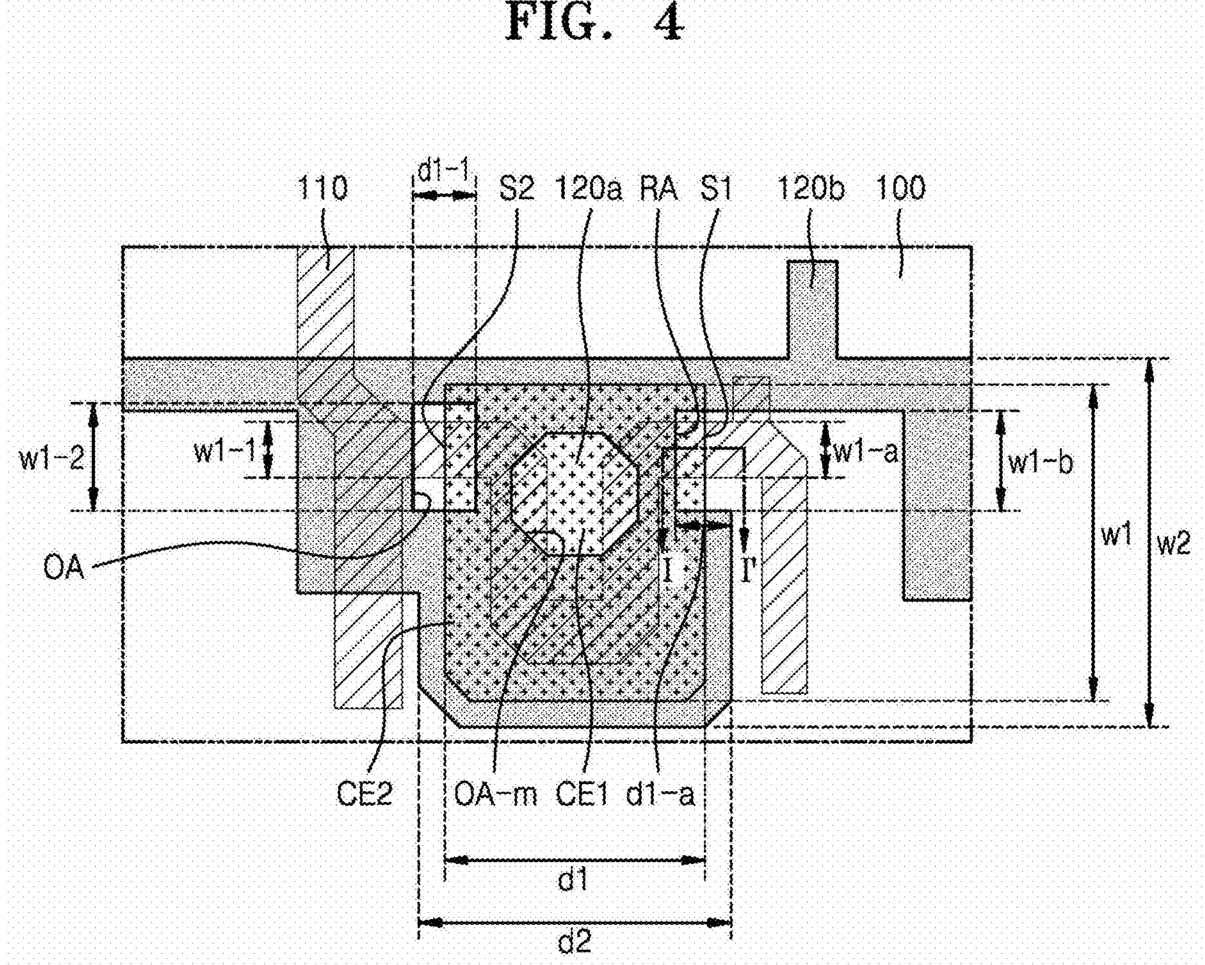
FIG. 4 is a plan view illustrating a pixel and a region around the pixel of FIG. 1 by focusing on a semiconductor layer, a first gate layer, and a second gate layer, according to an embodiment.

FIG. 4 is a plan view illustrating a pixel and a region around the pixel of FIG. 1 by focusing on a semiconductor layer, a first gate layer, and a second gate layer, according to an embodiment. For reference, repeated aspects or aspects of FIG. 4 that are the same as the aspects described above may not be described.

As illustrated in FIG. 4, a display apparatus according to an embodiment may include the substrate 100, the semiconductor layer 110, the gate insulating layer 102, the first gate layer **120*a*, the first interlayer-insulating layer 103*a*, and the second gate layer 120*b***.

The semiconductor layer 110 may be arranged on the substrate 100 as described above, the gate insulating layer 102 may be arranged on the semiconductor layer 110, and the first gate layer **120*a* may be arranged on the gate insulating layer 102 and may be insulated from the semiconductor layer 110 by the gate insulating layer 102**.

The semiconductor layer 110 may be crystallized by an excimer laser annealing ("ELA") process. By implementing the ELA process, the semiconductor layer 110 may be heated to a high temperature. When the semiconductor layer 110 is heated to a high temperature, at least one protrusion may be formed on an upper surface of the semiconductor layer 110. The at least one protrusion may protrude in a direction perpendicular to the substrate 100.

The first gate layer 120*a* may include a plurality of edges including a first edge S1. In an embodiment, for example, the plurality of edges may refer to edges defining the first electrode portion CE1 of the first gate layer 120*a*. The plurality of edges may include the first edge S1 and a second edge S2.

A direction in which the first edge S1 extends may be indicated as a first direction. The plurality of edges of the first gate layer 120*a* may further include the second edge S2 facing the first edge S1. A direction in which the second edge S2 extends may be indicated as a second direction. The first direction and the second direction may be parallel to each other. In addition, the plurality of edges may further include other edges arranged at or around a portion of the first gate layer 120*a*, the portion vertically overlapping the second gate layer 120*b* in a plan view.

The first gate layer 120*a* may overlap the semiconductor layer 110 when viewed in the direction perpendicular to the substrate 100. In detail, the first gate layer 120*a* may overlap the channel area of the semiconductor layer 110 in a plan view. The channel area of the semiconductor layer 110 may be arranged between the source/drain areas of the semiconductor layer 110.

The first interlayer-insulating layer 103*a* may be arranged on the first gate layer 120*a*, and the second gate layer 120*b* may be arranged on the first interlayer-insulating layer 103*a* and may overlap at least a portion of the first gate layer 120*a* when viewed in the direction perpendicular to the substrate 100. For example, the second electrode portion CE2 of the second gate layer 120*b* may vertically overlap the first electrode portion CE1 of the first gate layer 120*a* in a plan view.

The second gate layer 120*b* may expose at least a portion of the first edge S1 of the first gate layer 120*a*. For example, the second gate layer 120*b* may define an opening or a notch portion therein to expose the at least a portion of the first edge S1. The at least a portion of the first edge S1 may overlap the semiconductor layer 110 when viewed in the direction perpendicular to the substrate 100.

The at least one protrusion (see P1 of FIG. 5) of the semiconductor layer 110 may be arranged below the at least a portion of the first edge S1 of the first gate layer 120*a*. The at least a portion of the first edge S1 may protrude in the direction perpendicular to the substrate 100 due to the at least one protrusion (see P1 of FIG. 5) therebelow. In particular, the effect of the protrusion arranged below may increase for the edge portion of the first gate layer 120*a*. When the at least a portion of the first edge S1 protrudes, the protruding portion may be significantly more likely to become electrically connected to the second gate layer 120*b*. When the first edge S1 and the second gate layer 120*b* are electrically connected to each other, the storage capacitor Cst formed by including the first gate layer 120*a* and the second gate layer 120*b* may be affected, and thus, the characteristics of the display apparatus may deteriorate.

To prevent the deterioration described above, a portion of the second gate layer 120*b*, the portion corresponding to the at least a portion of the first edge S1 of the first gate layer 120*a*, may be removed, in order to prevent electrical connection between the first edge S1 and the second gate layer 120*b*. To this end, the second gate layer 120*b* may expose at least a portion of the first edge S1, and to do so, may include the opening or the notch portion. As a result, the at least a portion of the first edge S1 may be apart from the second gate layer 120*b*.

Thus, because the first gate layer 120*a* and the second gate layer 120*b* are not electrically connected to each other and are insulated from each other, the breakdown voltage characteristic of a thin-film transistor connected to the storage capacitor Cst including the first electrode portion CE1 of the first gate layer 120*a* and the second electrode portion CE2 of the second gate layer 120*b* may be improved.

In addition, a leakage current which may occur between the first electrode portion CE1 and the second electrode portion CE2 may also be prevented. As a result, a screen when the display apparatus is in an off state may have further reduced brightness.

For example, the second gate layer 120*b* of the display apparatus of FIG. 4 may include a first notch portion RA to upwardly expose at least a portion of the first edge S1. In this specification, a notch portion may denote a portion recessed toward a portion around the center of the second gate layer 120*b* when viewed in a direction perpendicular to the substrate 100 (i.e., plan view: view in a thickness direction z of the substrate 100). That is, in this specification, the notch portion may be a portion formed by removing a portion of the second gate layer 120*b*, the notch portion having a notch shape. Through the first notch portion RA, the at least a portion of the first edge S1 may be upwardly exposed. However, in certain cases, the first notch portion RA may be substituted by an opening.

For example, the second gate layer 120*b* of the display apparatus of FIG. 4 may include a first opening OA to upwardly expose at least a portion of the second edge S2. Through the first opening OA, the at least a portion of the second edge S2 may be upwardly exposed. However, in certain cases, the first opening OA may be substituted by a notch portion.

When viewed in the direction perpendicular to the substrate 100, at least one protrusion (see P1 of FIG. 5) of a plurality of protrusions may overlap at least a portion of the first edge S1. When viewed in the direction perpendicular to the substrate 100, at least one other protrusion (not shown) of the plurality of protrusions may overlap at least a portion of the second edge S2.

At least one other protrusion of the semiconductor layer 110 may be arranged below the at least a portion of the second edge S2 of the first gate layer 120*a*. The at least a portion of the second edge S2 may protrude in the direction perpendicular to the substrate 100 due to the at least one other protrusion therebelow. In particular, the effect of the protrusion arranged below may increase for the edge portion of the first gate layer 120*a*. When the at least a portion of the second edge S2 protrudes, the protruding portion may be significantly more likely to become electrically connected to the second gate layer 120*b*. When the second edge S2 and the second gate layer 120*b* are electrically connected to each other, the storage capacitor Cst formed by including the first gate layer 120*a* and the second gate layer 120*b* may be affected, and thus, the characteristics of the display apparatus may deteriorate.

To prevent the deterioration described above, a portion of the second gate layer 120*b*, the portion corresponding to the at least a portion of the second edge S2 of the first gate layer 120*a*, may be removed, in order to prevent electrical connection between the second edge S2 and the second gate layer 120*b*. To this end, the second gate layer 120*b* may expose at least a portion of the second edge S2, and to do so, may include the opening or the notch portion. As a result, the at least a portion of the second edge S2 may be apart from the second gate layer 120*b*.

The semiconductor layer 110 may have a 1-a$^{th}$ width w1-a in the first direction in which the first edge S1 extends, and the opening or the notch portion may have a 1-b$^{th}$ width w1-b in the first direction. Here, the 1-a$^{th}$ width w1-a may be less than the 1-b$^{th}$ width w1-b. As illustrated in FIG. 4, the 1-b$^{th}$ width w1-b may be a width of the first notch portion RA in the first direction.

The first gate layer 120*a* and the semiconductor layer 110 may overlap each other in a plan view by the 1-a$^{th}$ width w1-a. The first edge S1 of the first gate layer 120*a* and the semiconductor layer 110 may overlap each other in the plan view by the 1-a$^{th}$ width w1-a. Thus, the width of the first notch portion RA in the first direction may have to be greater than the 1-a$^{th}$ width w1-a. That is because the entire overlapping portion between the first edge S1 and the semiconductor layer 110 may have to be upwardly exposed through the first notch portion RA, because only when the entire overlapping portion is upwardly exposed, electrical connection between the first gate layer 120*a* and the second gate layer 120*b* may be prevented.

For example, the widths may have numerical values as below.

The 1-a$^{th}$ width w1-a of the semiconductor layer 110 may be greater than or equal to 1 micrometer (μm) and less than or equal to 6 μm and desirably, may be about 3 μm.

The 1-b$^{th}$ width w1-b of the first notch portion RA may be greater than the 1-a$^{th}$ width w1-a by about 1.5 μm or more. That is, the 1-b$^{th}$ width w1-b of the first notch portion RA may be greater than or equal to 2.5 μm and less than or equal to 7.5 μm and desirably, may be about 4.9 μm. However, as the 1-b$^{th}$ width w1-b increases, a removed portion of the second gate layer 120*b* is increased, and thus, the capacity of the storage capacitor Cst may be reduced.

A 1-a$^{th}$ length d1-a by which the first notch portion RA is recessed toward a central portion of the second gate layer 120*b* may denote a length of the first notch portion RA in a third direction crossing the first direction described above, for convenience of explanation. The 1-a$^{th}$ length d1-a may be greater than or equal to 1 μm and less than or equal to 2.5 μm and desirably, may be about 2.7 μm. That is, the 1-a$^{th}$ length d1-a may be less than the 1-b$^{th}$ width w1-b.

The 1-a$^{th}$ length d1-a may be greater than a width in the third direction of a portion of the first gate layer 120*a*, the portion being upwardly exposed by the first notch portion RA. The width in the third direction of the first gate layer 120*a* upwardly exposed by the first notch portion RA may be greater than or equal to 0.5 μm and less than or equal to 2 μm and desirably, may be about 1.2 μm. However, the 1-a$^{th}$ length d1-a and the width in the third direction of the portion of the first gate layer 120*a*, the portion being upwardly exposed by the first notch portion RA, may vary according to designs of the first gate layer 120*a* and the second gate layer 120*b*.

The semiconductor layer 110 may have a 1-1$^{st}$ width w1-1 in the second direction in which the second edge S2 extends, and the opening or the notch portion may have a 1-2$^{nd}$ width w1-2 in the second direction. Here, the 1-1$^{st}$ width w1-1 may be less than the 1-2$^{nd}$ width w1-2. As illustrated in FIG. 4, the 1-2$^{nd}$ width w1-2 may be a width of the first opening OA in the second direction. The second direction may be parallel with the first direction described above, but is not limited thereto.

The first gate layer 120*a* and the semiconductor layer 110 may overlap each other in a plan view by the 1-1$^{st}$ width w1-1. The first edge S1 of the first gate layer 120*a* may overlap the semiconductor layer 110 in the plan view by the 1-1$^{st}$ width w1-1. Thus, the width of the first opening OA in the second direction may have to be greater than the 1-1$^{st}$ width w1-1. That is because the entire overlapping portion between the second edge S2 and the semiconductor layer 110 may have to be upwardly exposed through the first opening OA, because only when the entire overlapping portion is upwardly exposed, electrical connection between the first gate layer 120*a* and the second gate layer 120*b* may be prevented.

For example, the widths may have numerical values as below.

The 1-1$^{st}$ width w1-1 of the semiconductor layer 110 may be greater than or equal to 1 μm and less than or equal to 6 μm and desirably, may be about 3 μm.

The 1-2$^{nd}$ width w1-2 of the first opening OA may be greater than the 1-1$^{st}$ width w1-1 by about 1.5 μm or more. That is, the 1-2$^{nd}$ width w1-2 of the first opening OA may be greater than or equal to 2.5 μm and less than or equal to 7.5 μm and desirably, may be about 4.9 μm. However, as the 1-2$^{nd}$ width w1-2 increases, a removed portion of the second gate layer 120*b* is increased, and thus, the capacity of the storage capacitor Cst may be reduced.

A 1-1$^{st}$ length d1-1 of the first opening OA in the third direction crossing the second direction described above may be greater than or equal to 1 μm and less than or equal to 2.5 μm and desirably, may be about 2.7 μm. That is, the 1-1$^{st}$ length d1-1 may be less than the 1-2$^{nd}$ width w1-2.

The 1-1$^{st}$ length d1-1 may be greater than a width in the third direction of a portion of the first gate layer 120*a*, the portion being upwardly exposed by the first opening OA. The width in the third direction of the portion of the first gate layer 120*a*, the portion being upwardly exposed by the first opening OA, may be greater than or equal to 0.5 μm and less than or equal to 2 μm and desirably, may be about 1.2 μm. However, the 1-1$^{st}$ length d1-1 and the width in the third direction of the portion of the first gate layer 120*a*, the portion being upwardly exposed by the first opening OA, may vary according to designs of the first gate layer 120*a* and the second gate layer 120*b*.

The second gate layer 120*b* may include a through-hole OA-m for electrical connection between the components vertically arranged with respect to the second gate layer 120*b*. For example, the first conductive layer 130 or the second conductive layer 140, the first conductive layer 130 or the second conductive layer 140 being arranged on the second gate layer 120*b*, may be electrically connected to the first gate layer 120*a*, through the through-hole OA-m. The through-hole OA-m may be arranged in at least a central portion of the second electrode portion CE2 of the second gate layer 120*b*, when viewed in a direction perpendicular to the substrate, and may upwardly expose at least a central portion of the first gate layer 120*a*.

As illustrated in FIG. 4, the first electrode portion CE1 may have a first width w1 in the first direction and may have a first length d1 in a direction crossing the first direction. The second electrode portion CE2 may have a second width w2 in the first direction and may have a second length d2 in a direction crossing the first direction. According to the present embodiment, the first width w1 may be less than the second width w2, and the first length d1 may be less than the second length d2.

The first length d1 may be greater than or equal to 10 prn and less than or equal to 70 μm and desirably, may be about 14 μm. However, the first length d1 may vary according to a size and resolution of a display panel.

The second length d2 may be greater than the first length d1 by at least 1 μm and more. The second length d2 may be greater than or equal to 11 μm and less than or equal to 71 μm and desirably, may be about 17 μm. The second length d2 may be defined such that the first gate layer 120*a* may be covered by the second gate layer 120*b* by taking into account process distribution.

The first width w1 may be greater than or equal to 10 μm and less than or equal to 70 μm and desirably, may be about 16.84 μm. However, the first width w1 may vary according to a size and resolution of a display panel.

The second width w2 may be greater than the first width w1 by at least 1 μm and more. The second width w2 may be greater than or equal to 11 μm and less than or equal to 71 μm and desirably, may be about 19.84 μm. The second width w2 may be defined such that the first gate layer 120*a* may be covered by the second gate layer 120*b* by taking into account process distribution.

As described above, according to the present embodiment, the second gate layer 120*b* may entirely cover the first gate layer 120*a*, when viewed in a direction perpendicular to the substrate 100 (i.e., plan view: view in a thickness direction z of the substrate 100). To this end, an area (an area including the opening and the notch portion) of the second gate layer 120*b* may be greater than an area of the first gate layer 120*a*.

Figure 5:
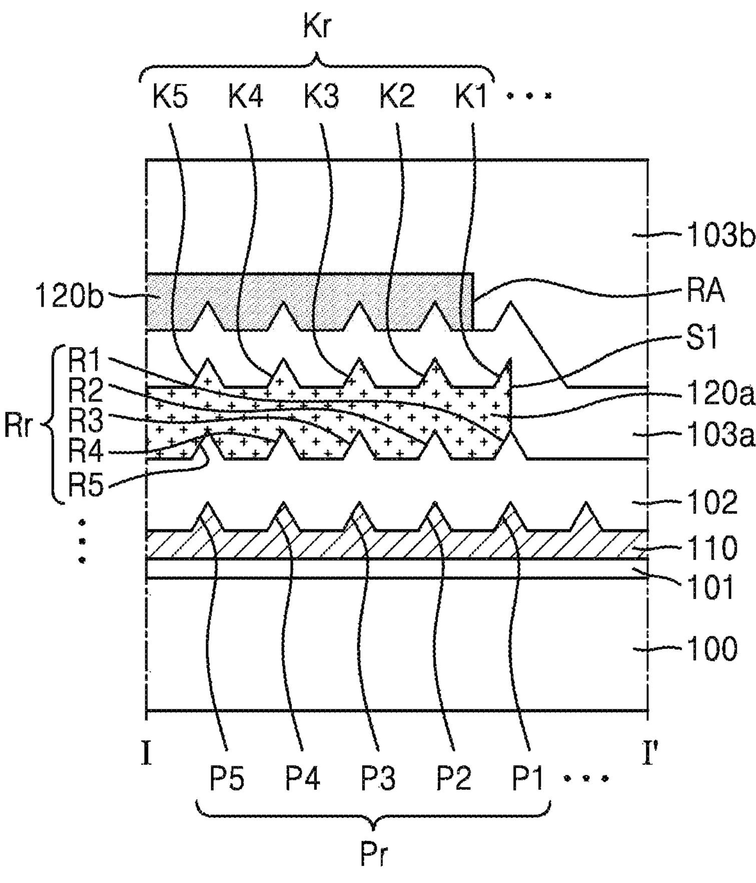
FIG. 5 is a cross-sectional view of the pixel and the region around the pixel of FIG. 4, taken along line I-I'.

FIG. 5 is a cross-sectional view of the pixel and the region around the pixel of FIG. 4, taken along line I-I'. For reference, with respect to FIG. 5, aspects that are the same as the aspects described above or repeated aspects may not be described.

As illustrated in FIG. 5, the first gate layer 120*a* may overlap the semiconductor layer 110 when viewed in a direction perpendicular to the substrate 100, and the second gate layer 120*b* may overlap the first gate layer 120*a* when viewed in the direction perpendicular to the substrate 100.

A plurality of protrusions Pr may be arranged on an upper surface of the semiconductor layer 110. As described above, the plurality of protrusions Pr may be formed by high temperature heat occurring in an ELA process. The plurality of protrusions Pr may sequentially include a 1-$1^{st}$ protrusion P1, a 1-$2^{nd}$ protrusion P2, a 1-$3^{rd}$ protrusion P3, a 1-$4^{th}$ protrusion P4, a 1-$5^{th}$ protrusion P5, etc. from the first edge S1. Also, although not shown in FIG. 5, the plurality of protrusions Pr may further and sequentially include a 2-$1^{st}$ protrusion (not shown), a 2-$2^{nd}$ protrusion (not shown), a 2-$3^{rd}$ protrusion (not shown), etc. from the second edge S2.

In a forming process, the gate insulating layer 102 may be affected by the plurality of protrusions Pr formed on an upper surface of the semiconductor layer 110. A plurality of recess portions having shapes corresponding to shapes of the plurality of protrusions Pr, respectively, may be formed on a lower surface of the gate insulating layer 102. The upper surface of the gate insulating layer 102 may have a shape corresponding to a shape of the plurality of protrusions Pr.

Likewise, in a forming process, the first gate layer 120*a* may also be affected by the plurality of protrusions Pr formed on the upper surface of the semiconductor layer 110 (or a plurality of protruding portions formed on the upper surface of the gate insulating layer 102). A plurality of recess portions Rr having shapes corresponding to the shapes of the plurality of protrusions Pr, respectively, may be formed on a lower surface of the first gate layer 120*a*. The plurality of recess portions Rr may sequentially include a 1-$1^{st}$ recess portion R1, a 1-$2^{nd}$ recess portion R2, a 1-$3^{rd}$ recess portion R3, a 1-4th recess portion R4, a 1-$5^{th}$ recess portion R5, etc. from the first edge S1. Also, although not shown in FIG. 5, the plurality of recess portions Rr may further and sequentially include a 2-$1^{st}$ recess portion (not shown), a 2-$2^{nd}$ recess portion (not shown), a 2-$3^{rd}$ recess portion (not shown), etc. from the second edge S2.

A plurality of protruding portions Kr having shapes corresponding to the shapes of the plurality of protrusions Pr, respectively, may be formed on an upper surface of the first gate layer 120*a*. The plurality of protruding portions Kr may sequentially include a 1-$1^{st}$ protruding portion K1, a 1-$2^{nd}$ protruding portion K2, a 1-$3^{rd}$ protruding portion K3, a 1-$4^{th}$ protruding portion K4, a 1-$5^{th}$ protruding portion, etc. from the first edge S1. Also, although not shown in FIG. 5, the plurality of protruding portions Kr may further and sequentially include a 2-$1^{st}$ protruding portion (not shown), a 2-$2^{nd}$ protruding portion (not shown), a 2-$3^{rd}$ protruding portion (not shown), etc. from the second edge S2.

The plurality of protruding portions Kr on the upper surface of the first gate layer 120*a* may further include the 2-$1^{st}$ protruding portion. Although the 2-$1^{st}$ protruding portion is not shown in FIG. 5, a position of the 2-$1^{st}$ protruding portion may be obvious based on FIG. 4 described above.

When the second gate layer 120*b* covers the first gate layer 120*a*, the second gate layer 120*b* may be formed to cover the first edge S1 of the first gate layer 120*a*, and thus, the second gate layer 120*b* may have a step difference corresponding to a height of the first edge S1 of the first gate layer 120*a*. In an area corresponding to the step difference, the first gate layer 120*a* and the second gate layer 120*b* may be electrically connected to each other due to a protruding shape of the first edge S1 of the first gate layer 120*a*. To solve this problem, a portion of the second gate layer 120*b*, the portion being located on the first edge S1 of the first gate layer 120*a*, may be removed. As a result, as illustrated in FIG. 5, the second gate layer 120*b* may include the first notch portion RA.

As described above, in a forming process, the first gate layer 120*a* may be affected by the plurality of protrusions Pr arranged on the upper surface of the semiconductor layer 110. That is, the first gate layer 120*a* may have a shape corresponding to a shape of the plurality of protrusions Pr arranged on the upper surface of the semiconductor layer 110. The plurality of protruding portions Kr corresponding to the plurality of protrusions Pr, respectively, may be arranged on the upper surface of the first gate layer 120*a*. The upper surface of the first gate layer 120*a* may include the 1-$1^{st}$ protruding portion K1 corresponding to the 1-$1^{st}$ protrusion P1 from among the plurality of protrusions Pr.

The first gate layer 120*a* may include the 1-$1^{st}$ protruding portion K1 and the 2-$1^{st}$ protruding portion (not shown) on the upper surface thereof.

The 1-$1^{st}$ protruding portion K1 may be a portion protruding in a direction perpendicular to the substrate 100 by being affected by the 1-$1^{st}$ protrusion P1 arranged below the first edge S1. A shape of the 1-$1^{st}$ protruding portion K1 may correspond to a shape of the 1-$1^{st}$ protrusion P1 arranged below the first edge S1. Other protrusions in addition to the 1-$1^{st}$ protrusion P1 may further be arranged below the first edge S1. Thus, it may be described that at least one protrusion may be arranged below the first edge S1.

When viewed in the direction perpendicular to the substrate 100 (i.e., in a plan view), the 1-$1^{st}$ protruding portion K1 and the first edge S1 may overlap each other. The 1-$1^{st}$ protruding portion K1 may be upwardly exposed through the first notch portion RA. The 1-$1^{st}$ protruding portion K1 may be apart from the second gate layer 120*b*. The 1-$1^{st}$ protruding portion K1 may be electrically insulated from the second gate layer 120*b*.

The 2-1$^{st}$ protruding portion may be a portion protruding in the direction perpendicular to the substrate 100 by being affected by at least one protrusion arranged below the second edge S2. A shape of the 2-1$^{st}$ protruding portion may correspond to a shape of the at least one protrusion arranged below the second edge S2. Other protrusions in addition to the 2-1$^{st}$ protrusion may further be arranged below the second edge S2. Thus, it may be described that at least one other protrusion may be arranged below the second edge S2.

When viewed in the direction perpendicular to the substrate 100 (i.e., in a plan view), the 2-1$^{st}$ protruding portion and the second edge S2 may overlap each other. The 2-1$^{st}$ protruding portion may be upwardly exposed through the first opening OA. The 2-1$^{st}$ protruding portion may be apart from the second gate layer 120*b*. The 2-1$^{st}$ protruding portion may be electrically insulated from the second gate layer 120*b*.

The second gate layer 120*b* according to FIGS. 4 and 5 above and a second gate layer not including an opening and a notch portion may be compared as shown in the following table. However, except for the design of the second gate layer, specifications of the remaining layers may be the same.

TABLE 1

| | Using the second gate layer 120b of FIGS. 4 and 5 | Comparative Embodiment (Using a second gate layer not including an opening and a notch portion) |
|---|---|---|
| Breakdown Voltage (V) | 80 | 48 |
| Pixel-Off (%) | 1.5 | 24.22 |

As shown in Table 1, a significant difference in the breakdown voltage an the pixel-off is identified between the case where the second gate layer 120*b* of FIG. 4 is used and the case of the comparative embodiment. As the pixel-off decreases, it denotes that the pixel yield rate increases.

Figure 6:
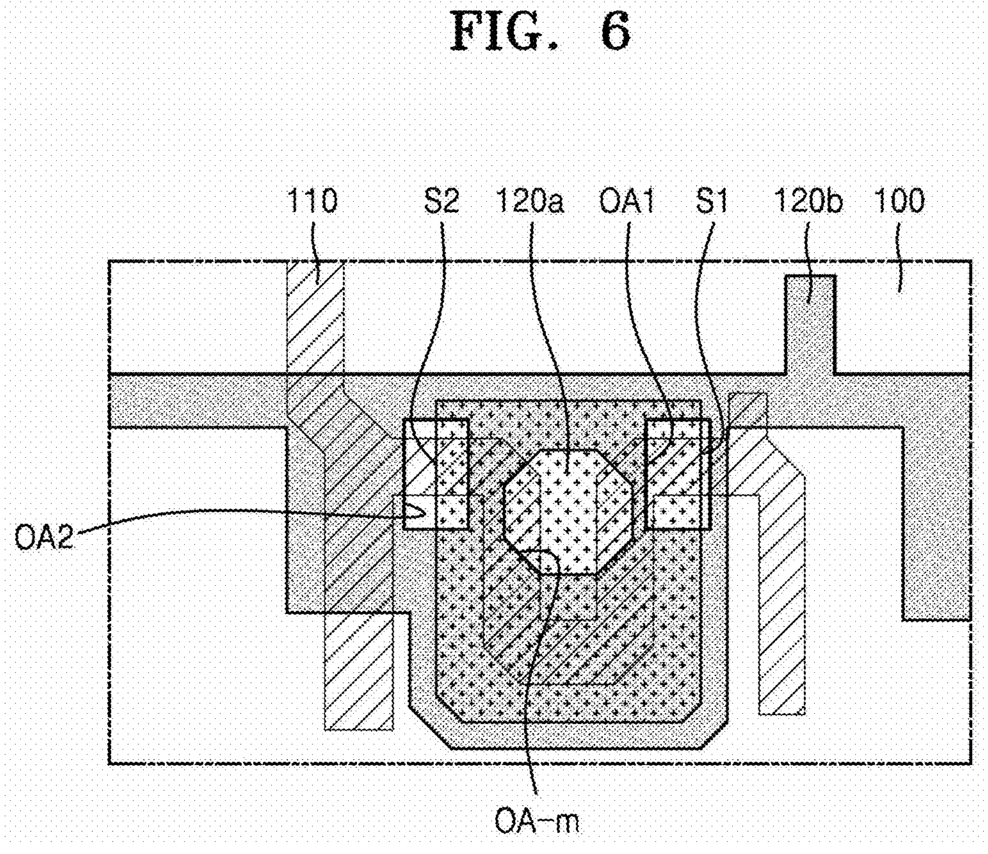
FIG. 6 is a plan view illustrating a pixel and a region around the pixel of FIG. 1 by focusing on a semiconductor layer, a first gate layer, and a second gate layer, according to another embodiment.

FIG. 6 is a plan view illustrating a pixel and a region around the pixel of FIG. 1 by focusing on a semiconductor layer, a first gate layer, and a second gate layer, according to another embodiment. For reference, with respect to FIG. 6, aspects that are the same as the aspects described above or repeated aspects may not be described.

As illustrated in FIG. 6, the second gate layer 120*b* may include at least two openings, namely, a 1-1$^{st}$ opening OA1 and a 1-2$^{nd}$ opening OA2, to upwardly expose lower components. As described above, the second gate layer 120*b* may upwardly expose the first edge S1 and the second edge S2 of the first gate layer 120*a* by using the at least two openings OA1 and OA2. The second gate layer 120*b* may upwardly expose the 1-1$^{st}$ protruding portion K1 of the first edge S1 and the 2-1$^{st}$ protruding portion (not shown) of the second edge S2 by using the at least two openings OA1 and OA2.

The 1-1$^{st}$ opening OA1 may indicate an opening upwardly exposing at least a portion of the first edge S1 of the first gate layer 120*a*. The 1-1$^{st}$ opening OA1 may indicate an opening upwardly exposing the 1-1$^{st}$ protruding portion K1. The 1-2$^{nd}$ opening OA2 may indicate an opening upwardly exposing at least a portion of the second edge S2 of the first gate layer 120*a*. In an embodiment, for example, the 1-1$^{st}$ opening OA1 and the 1-2$^{nd}$ opening OA2 may have the same size as each other.

In an embodiment, for example, a width of the 1-1$^{st}$ opening OA1 in the first direction in which the first edge S1 extends may be greater than a width of the semiconductor layer 110 in the first direction. The width of the semiconductor layer 110 in the first direction may denote a width of a portion arranged in the 1-1$^{st}$ opening OA1 in a plan view.

A width of the 1-2$^{nd}$ opening OA2 in the second direction in which the second edge S2 extends may be greater than a width of the semiconductor layer 110 in the second direction. The width of the semiconductor layer 110 in the second direction may denote a width of a portion arranged in the 1-2$^{nd}$ opening OA2 in the plan view. Also, the second direction may denote a direction parallel with the first direction.

For convenience of explanation, the width of the 1-1$^{st}$ opening OA1 in the first direction may be the same or substantially the same as the 1-bth width w1-b of FIG. 4 described above, although not illustrated in FIG. 6. Also, the width of the semiconductor layer 110 overlapping the 1-1$^{st}$ opening OA1 in the plan view may be the same or substantially the same as the 1-ath width w1-a of FIG. 4.

For convenience of explanation, the width of the 1-2nd opening OA2 in the second direction may be the same or substantially the same as the 1-2nd width w1-2 of FIG. 4 described above, although not illustrated in FIG. 6. Also, the width of the semiconductor layer 110 overlapping the 1-2nd opening OA2 in the plan view may be the same or substantially the same as the 1-1st width w1-1 of FIG. 4.

Figure 7:
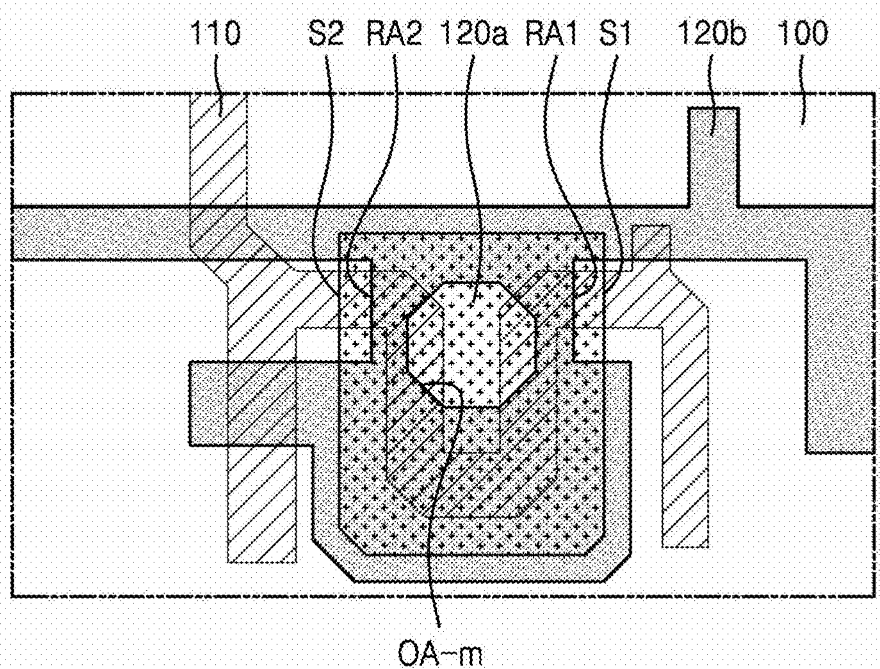
FIG. 7 is a plan view illustrating a pixel and a region around the pixel of FIG. 1 by focusing on a semiconductor layer, a first gate layer, and a second gate layer, according to another embodiment.

FIG. 7 is a plan view illustrating a pixel and a region around the pixel of FIG. 1 by focusing on a semiconductor layer, a first gate layer, and a second gate layer, according to another embodiment. For reference, with respect to FIG. 7, aspects that are the same as the aspects described above or repeated aspects may not be described.

As illustrated in FIG. 7, the second gate layer 120*b* may include at least two notch portions, namely, a 1-1$^{st}$ notch portion RA1 and a 1-2$^{nd}$ notch portion RA2, to upwardly expose lower components. As described above, the second gate layer 120*b* may upwardly expose the first edge S1 and the second edge S2 of the first gate layer 120*a* by using the at least two notch portions RA1 and RA2. The second gate layer 120*b* may upwardly expose the 1-1$^{st}$ protruding portion K1 of the first edge S1 and the 2-1$^{st}$ protruding portion (not shown) of the second edge S2 by using the at least two notch portions RA1 and RA2.

The 1-1$^{st}$ notch portion RA1 may indicate an opening upwardly exposing at least a portion of the first edge S1 of the first gate layer 120*a*. The 1-1$^{st}$ notch portion RA1 may indicate an opening upwardly exposing the 1-1$^{st}$ protruding portion K1. The 1-2$^{nd}$ notch portion RA2 may indicate an opening upwardly exposing at least a portion of the second edge S2 of the first gate layer 120*a*. In an embodiment, for example, the 1-1$^{st}$ notch portion RA1 and the 1-2$^{nd}$ notch portion RA2 may have the same size as each other.

In an embodiment, for example, a width of the 1-1$^{st}$ notch portion RA1 in the first direction in which the first edge S1 extends may be greater than a width of the semiconductor layer 110 in the first direction. The width of the semiconductor layer 110 in the first direction may denote a width of the semiconductor layer 110 arranged in the 1-1$^{st}$ notch portion RA1 in a plan view.

A width of the 1-2$^{nd}$ notch portion RA2 in the second direction in which the second edge S2 extends may be greater than a width of the semiconductor layer 110 in the second direction. The width of the semiconductor layer 110 in the second direction may denote a width of the semiconductor layer 110 arranged in the 1-2$^{nd}$ notch portion RA2 in the plan view. Also, the second direction may denote a direction parallel with the first direction.

For convenience of explanation, the width of the 1-1$^{st}$ notch portion RA1 in the first direction may be the same or substantially the same as the 1-bth width w1-b of FIG. 4 described above, although not illustrated in FIG. 7. Also, the width of the semiconductor layer 110 overlapping the 1-1$^{st}$ notch portion RAI in the plan view may be the same or substantially the same as the 1-ath width w1-a of FIG. 4.

For convenience of explanation, the width of the 1-2$^{nd}$ notch portion RA2 in the second direction may be the same or substantially the same as the 1-2nd width w1-2 of FIG. 4 described above, although not illustrated in FIG. 7. Also, the width of the semiconductor layer 110 overlapping the 1-2$^{nd}$ notch portion RA2 in the plan view may be the same or substantially the same as the 1-1st width w1 of FIG. 4.

Figure 8:
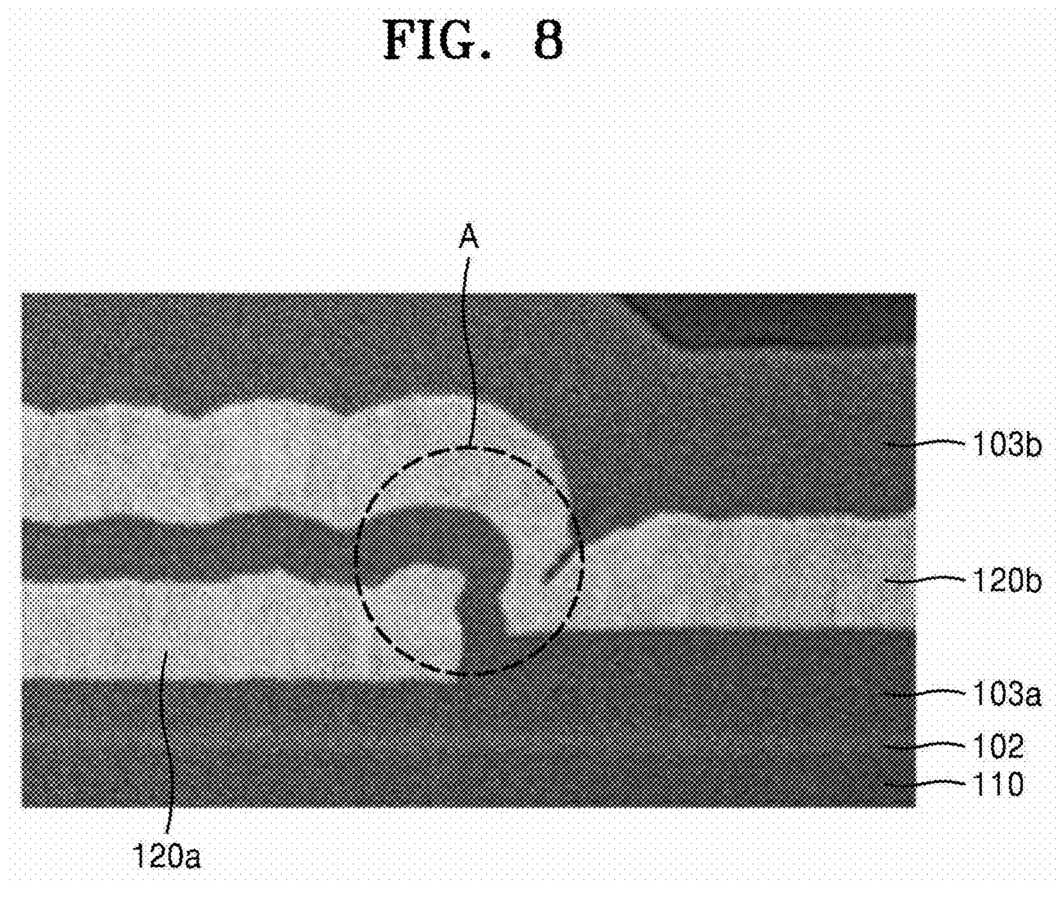
FIG. 8 is a picture schematically showing a cross-section of a display apparatus by focusing on a first gate layer and a second gate layer, according to a comparative embodiment.

FIG. 8 is a picture schematically showing a cross-section of a display apparatus by focusing on a first gate layer and a second gate layer, according to a comparative embodiment.

As illustrated in FIG. 8, region A shows a shape of an edge of the first gate layer 120*a*, the edge protruding in a direction perpendicular to the substrate 100. The second gate layer 120*b* may be formed to cover the edge of the first gate layer 120*a*. As a result, the second gate layer 120*b* may form a step difference along the edge of the first gate layer 120*a*.

To see region A, the protruding edge of the first gate layer 120*a* and the step difference of the second gate layer 120*b* are close to each other. Thus, in certain cases, the protruding edge of the first gate layer 120*a* may contact or may be electrically connected with the second gate layer 120*b*, and in this case, the storage capacitor Cst may deteriorate.

According to the one or more of the embodiments described above, a display apparatus capable of preventing contact between electrodes included in a storage capacitor may be realized. However, the scope of the disclosure is not limited to these effects as described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
- a substrate;
- a semiconductor layer arranged on the substrate and including a plurality of protrusions protruding in a direction perpendicular to the substrate;
- a gate insulating layer arranged on the semiconductor layer;
- a first gate layer arranged on the gate insulating layer and including a first edge arranged on at least one protrusion of the plurality of protrusions;
- a first interlayer-insulating layer arranged on the first gate layer; and
- a second gate layer arranged on the first interlayer-insulating layer, overlapping the first gate layer when viewed in the direction perpendicular to the substrate, and upwardly exposing at least a portion of the first edge when viewed in the direction perpendicular to the substrate.

2. The display apparatus of claim 1, wherein, when viewed in the direction perpendicular to the substrate, the at least one protrusion and the at least a portion of the first edge overlap each other.

3. The display apparatus of claim 2, wherein the at least a portion of the first edge includes a 1-1$^{st}$ protruding portion protruding in the direction perpendicular to the substrate, correspondingly to the at least one protrusion.

4. The display apparatus of claim 3, wherein, when viewed in the direction perpendicular to the substrate, the second gate layer upwardly exposes the 1-1$^{st}$ protruding portion.

5. The display apparatus of claim 4, wherein the 1-1$^{st}$ protruding portion is spaced apart from the second gate layer.

6. The display apparatus of claim 4, wherein the second gate layer defines an opening or a notch portion therein upwardly exposing the 1-1$^{st}$ protruding portion when viewed in the direction perpendicular to the substrate.

7. The display apparatus of claim 6, wherein the semiconductor layer has a 1-a$^{th}$ width in a first direction in which the first edge extends,
- the opening or the notch portion has a 1-b$^{th}$ width in the first direction, and
- the 1-a$^{th}$ width is less than the 1-b$^{th}$ width.

8. The display apparatus of claim 1, wherein the first gate layer further includes a second edge facing the first edge, and the second edge is arranged on at least one other protrusion of the plurality of protrusions.

9. The display apparatus of claim 8, wherein the second gate layer upwardly exposes at least a portion of the second edge when viewed in the direction perpendicular to the substrate.

10. The display apparatus of claim 9, wherein, when viewed in the direction perpendicular to the substrate, the at least one other protrusion of the plurality of protrusions and the at least a portion of the second edge overlap each other.

11. The display apparatus of claim 10, wherein the at least a portion of the second edge includes a 2-1$^{st}$ protruding portion protruding in the direction perpendicular to the substrate, correspondingly to the at least one other protrusion.

12. The display apparatus of claim 11, wherein, when viewed in the direction perpendicular to the substrate, the second gate layer upwardly exposes the 2-1$^{st}$ protruding portion.

13. The display apparatus of claim 11, wherein the 2-1$^{st}$ protruding portion is spaced apart from the second gate layer.

14. The display apparatus of claim 11, wherein the second gate layer defines an opening or a notch portion therein upwardly exposing the 2-1$^{st}$ protruding portion when viewed in the direction perpendicular to the substrate.

15. The display apparatus of claim 14, wherein the semiconductor layer has a 1-1$^{st}$ width in a second direction in which the second edge extends,
- the opening or the notch portion has a 1-2$^{nd}$ width in the second direction, and
- the 1-1$^{st}$ width is less than the 1-2$^{nd}$ width.

16. A display apparatus comprising:
- a substrate;
- a semiconductor layer arranged on the substrate and including a plurality of protrusions on an upper surface thereof;

a first gate layer arranged on the semiconductor layer, insulated from the semiconductor layer, and including, on an upper surface thereof, a plurality of protruding portions having a shape corresponding to a shape of the plurality of protrusions; and a second gate layer covering the first gate layer, insulated from the first gate layer, and, when viewed in a direction perpendicular to the substrate, upwardly exposing a 1-1$^{st}$ protruding portion from among the plurality of protruding portions, wherein the 1-1$^{st}$ protruding portion is arranged on a first edge of the first gate layer.

17. The display apparatus of claim 16, wherein the second gate layer defines an opening or a notch portion therein upwardly exposing the 1-1$^{st}$ protruding portion when viewed in the direction perpendicular to the substrate.

18. The display apparatus of claim 16, wherein the first gate layer includes a second edge facing the first edge, the second gate layer upwardly exposes a 2-1$^{st}$ protruding portion from among the plurality of protruding portions, and the 2-1$^{st}$ protruding portion is arranged on the second edge.

19. The display apparatus of claim 18, wherein the second gate layer defines an opening or a notch portion therein exposing the 2-1$^{st}$ protruding portion when viewed in the direction perpendicular to the substrate.

* * * * *